United States Patent [19]

Ono et al.

[11] 4,318,003
[45] Mar. 2, 1982

[54] METHOD AND MACHINE FOR POSITIONING FILMS ON BASE SHEETS

[75] Inventors: Yoshio Ono; Takashi Sakamoto; Tetsuo Sano, all of Kyoto, Japan

[73] Assignee: Dainippon Screen Seizo Kabushiki Kaisha, Kyoto, Japan

[21] Appl. No.: 139,209

[22] Filed: Apr. 11, 1980

[30] Foreign Application Priority Data

Feb. 14, 1979 [JP] Japan .................................. 54-14911
Apr. 16, 1979 [JP] Japan .................................. 54-46499

[51] Int. Cl.³ .......................................... G01N 21/86
[52] U.S. Cl. .................................... 250/548; 356/401
[58] Field of Search ................ 250/548, 557; 356/400, 356/401; 101/126

[56] References Cited

U.S. PATENT DOCUMENTS 4,269,505 5/1981 Mayer ............................ 250/548 X Primary Examiner—David C. Nelms
Assistant Examiner—Darwin R. Hostetter
Attorney, Agent, or Firm—Lackenbach, Siegel, Marzullo, Presta & Aronson

[57] ABSTRACT

A method and machine for positioning films on base sheets are disclosed. A first film on a base sheet is laid out into a desired position on a base plate, and positions of edges of a picture pattern on the first film are detected by photoelectric detectors including photoelectric elements which detect the edges and output signals whose strengths are varied depending on the positions of the elements with respect to the edges. Then, a second film on a base sheet is put on the first film so that edges of a picture pattern of the same shape as in the first film, on the second film may approximately overlap to those of the first film, and the edges in the second film are completely coincided with those in the first film by moving the second film by means of a drive means according to the output signals from the elements, thereby positioning the second film into the desired position.

12 Claims, 13 Drawing Figures

METHOD AND MACHINE FOR POSITIONING FILMS ON BASE SHEETS

BACKGROUND OF THE INVENTION

The present invention relates to a method and machine for positioning films, such as color separation films used in multi-color printing, on transparent base sheets according to a desired layout.

As is well known, color printing is performed by superimposing different colored inks by employing a plurality of printing plates which are produced by separating an original picture into several colors; for example, cyan, magenta, yellow, and black.

When a printing layout includes several pictures, each picture is generally color-separated independently and color separation films of each picture are made separately. Then, the color separation films for each color are collated and mounted on a transparent base and are printed in contact with a printing plate material such as a pre-sensitized plate to obtain an original color separation plate for printing of the desired layout.

It is essential that the various color plates print precisely in coincidence, to prevent "color mackle", which would otherwise impair the printing quality, and thus critical that the relative positions of the various picture, mounted on the layouts for each color, exactly correspond. Hitherto, several methods have been developed for performing the positioning operation of mounting the color separation films on the layouts, and a summary of some of these known methods will not be given.

In the first method, which is at present the most frequencntly used, position lines for the original films are drawn on a backing sheet of the necessary size, according to the desired layout. A transparent base is overlaid on the backing sheet and then for one of the separation colors, the separation films for each picture are laid individually on the transparent base by adjusting registration marks on the films to coincide with marks on the backing sheet by eye and are secured to the transparent base by adhesive tape, to obtain a first original color separation plate. This process is repeated for each color to obtain all of the original color separation plates.

By this method, however, the accuracy of the setting positions of the film depends on the skill and care of an operator and accordingly it is unstable. Furthermore, the operation speed is low.

In a second known method, the transpatent bases for each color, and the original color separation films are provided with punched apertures and the positioning of the color separation films on the transparent bases is effected by inserting registering pins into the punched apertures.

In this method, for instance, when four color inks are used for printing, four transparent bases (one of each color) are put on the backing sheet and the four original color separation films of each picture are placed on the four trasparent bases one by one, according to the desired layout. Then the four transparent bases and each set of four color separation films are punched all together in a single operation, and then separated one from another. The transparent base sheets and the color separation films of each color, which are recollated, are positioned by using the register pins, as mentioned above. In practice, however, this method is prone to errors due to slippage when the eight film sheets are punched together. If, for example, the operator uses a hand-held power drill for the punching operation, which is convenient in a plate-making factory, it is fairly difficult to maintain a position perpendicular to the film sheets, so errors in the alignment of the apertures in the film sheets are liable to occur. Furthermore, the operation of inserting and removing the registering pins is troublesome and time consuming.

In a third method, the positions of the register marks of the original color separation films are detected by photoelectric detector means and the films are automatically moved to the correct positions if the register marks are out of alignment, and then are provided with the punched apertures. Then, the original color separation films are laid out on a transparent base sheet which is positioned by inserting the register pins into its punched apertures, by a pinbar, having a pair of standing pins for locating the original color separation film, capabe of moving upward and downward and the X and Y directions over the setting surface of the base sheet for the color separation films. In this method, first the color separation films of one color are located in the desired positions by locating the color separation films for each picture in turn to the pinbar is moved to the desired alignment on the layout. Then the position of the color separation film is stored into a memory, and the setting operation for the color separation films of the other colors on the base sheet is repeated by utilizing the stored data in the memory. This method enables accurate positioning of the original films and is highly practicable but requires a large system and accordingly high costs are involved.

In a fourth method, as in the similar manner to the third method, first the original color separation films are automatically positioned in the correct positions and then are punched. Then, the color separation films of one color are laid out on the base sheet by locating the color separation films for each picture to a plurality of pinbars which are fixed to the desired positions during the operations. Then, the setting operation for the color separation films of the other colors on the base sheets is repeated in the same manner as described above. This method does not require a memory and enables accurate positioning of the films but again involves high cost.

SUMMARY OF THE INVENTION

It is an object of the present invention to provide a method for positioning films on base sheets free from the aforementioned defects, wherein the films are required no register marks, which is capable of a simple, quick and accurate positioning, and which does not require an accurate punching steps for the films.

It is also an object of the present invention to provide a machine for positioning films on base sheets free from the aforementioned defects, wherein the films are required no register marks, which is capable of a simple, quick and accurate positioning without an accurate punching means for the films.

According to the present invention there is provided a method for positioning films on base sheets, comprising the steps of (a) laying out a first film having a picture pattern on a first base sheet into a desired position, (b) detecting the positions of edges of the picture pattern in the first film by photoelectric detector means including photoelectric element means which detect the edges of the picture pattern and output signals whose strengths are varied depending on the positions of the photoelectric element means with respect to the edges, (c) overlaying a second film having a picture pattern of the same shape as that in the first film on a second base sheet to the first film so that the edges of the picture pattern in the second film may approximately overlap to those in the first film, and (d) moving the second film by a drive means so that the edges in the second film may completely be coincident with the those in the first film depending on the output signals from the photoelectric element means, thereby positioning the second film into the desired position.

According to the present invention there is also provided a machine for positioning films on base sheets, comprising (a) a base plate on which a first film having a picture pattern in a first base sheet is laid out into a desired position and a second film having a picture pattern of the same shape as that in the first film on a second base sheet is placed on the first film, (b) photoelectric detector means which are capable of moving over the base plate and include photoelectric element means which detect edges of the picture patterns and output signals whose strengths are varied depending on the positions of the photoelectric element means with respect to the edges, and (c) a drive means for moving the films over the base plate depending on the output signals from the photoelectric element means so that the edges of the picture pattern in the second film may completely be coincident with those in the first film, thereby positioning the second film into the desired position.

BRIEF DESCRIPTION OF DRAWINGS

In order that the present invention may be better understood, a preferred embodiment will now be described with reference to the accompanying drawings, in which.

DESCRIPTION OF AN PREFERRED EMBODIMENT

Before entering into the description of an embodiment of the present invention, the third method abovementioned will be described in connection with FIGS. 1 and 2.

Figure 1:
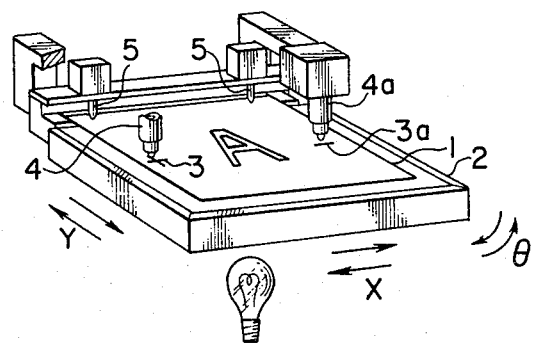
FIG. 1 is a perspective view of a conventional film positioning and punching machine.

A conventional positioning and punching machine is shown in FIG. 1, in which a color separation film 1 is placed on a table 2, and the table 2 is moved in order to position the color separating film 1 in the correct position wherein register marks 3 and 3' attached on the film 1 coincide with photoelectric detectors 4 and 4' including photoelectric detector elements. Then, the color separation film 1 is precisely provided with a pair of punched apertures in its upper portion by a pair of punches 5.

Figure 2:
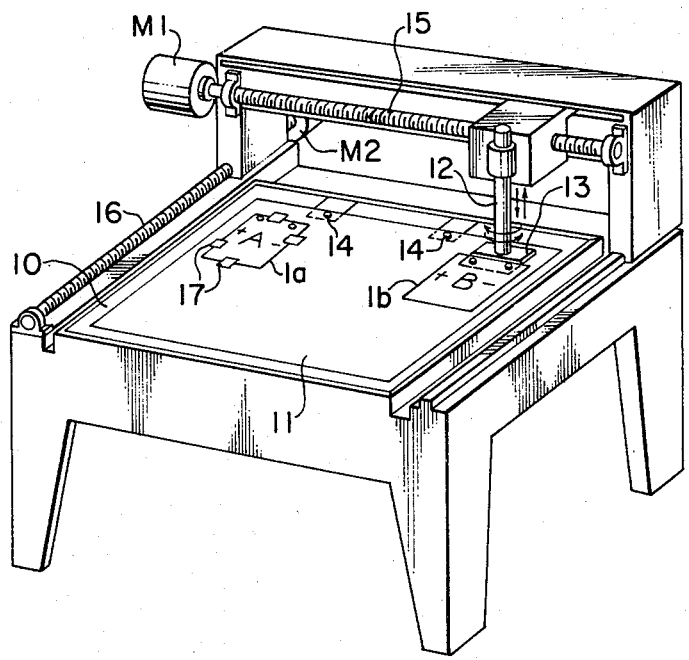
FIG. 2 is a perspective view of a conventional film layout machine.

In FIG. 2 is shown a conventional film layout machine. On a table 10 a backing sheet and a transparent base sheet 11 overlaid on it are positioned by locating register pins 14 into the punched apertures provided in the base sheet 11. Then first the color separation film 1a punched of one color is located onto a pinbar 13 mounted to the bottom of a movable vertical rod 12 which is adapted to be movable up and down and in X and Y directions by means of screw shafts 15 and 16 driven by motors M1 and M2, by inserting the pinbar into the punched apertures of the color separation film 1a. The pinbar 13 is moved to the desired position on the transparent base sheet 11 and the color separation film 1a is secured to the base sheet 11 by adhesive tapes 17.

The position (the X and the Y direction and an angle $\theta$) of the pinbar 13, that is, the position of the color separation film 1a is stored into a memory (not shown). Then, another color separation film 1b of one color is positioned in the desired position on the base sheet 11 and its position is stored into the memory in the same manner as described above. Then, the setting operation for the color separation films of the other colors on the other base sheets is repeated by utilizing the stored data in the memory.

One embodiment of the present invention will now be described with reference to FIGS. 3–13. The principle of the present method will be first explained in connection with FIGS. 3–6, before describing a machine for positioning films according to the present invention, shown in FIGS. 7–11.

Figure 3:
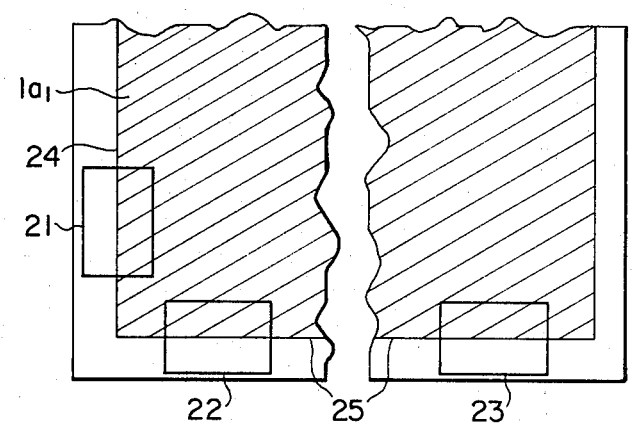
FIG. 3 shows photoelectric detector elements and edges of a picture pattern, which cooperate therewith, used in a method according to the present invention.

FIG. 3 shows schematically part of a first color separation film $1a_1$ including a picture pattern, and three photoelectric detector elements 21–23, the two 21 and 22 for the lower part of a left side edge 24 and the left part of a base edge 25 and the rest 23 for the right part of the base edge 25 of the picture pattern, which are included in left and right photoelectric edge detectors 33 and 34 which are located in the left and the right base corner portions of the picture pattern. At the end of the setting operation of the first color film $1a_1$, as shown in FIG. 3, the side edge 24 and the base edge 25 of the picture pattern are adjusted in the correct positions with respect to the three elements 21–23. In this embodiments, the edge means a frame of the film, any line in the picture, an outer edge of the picture, or the like. first color film $1a_1$ on a transparent base sheet, more specifically, the different positions of the side edge 24 of the picture pattern, partly shown, in the first color film which is moved with respect to the detector element 21, and the output level of the detector element 21.

When the side edge 24 of the picture pattern of the film $1a_1$ is located in a position P1, the element 21 is shaded entirely by the picture pattern, and outputs a signal having an output level L2. Then the side edge 24 is moved in the right hand side direction to a position P2. As the side edge 24 is moved from the position P2 wherein the element 21 is shaded entirely by the picture pattern, to a position P4 wherein the element 21 becomes out of the picture pattern, via a position P3 which is the center between the positions P2 and P4 and wherein the half of the element surface is shaded, the output level of the signal from the element 21 increases from L2 to L1 via Lc (in the position P3). Even then the side edge 24 is further moved in the right hand side direction, the output level L1 of the signal from the element 21 is the same because the entire surface of the element 21 receives the light.

Hence, if the correct position is the position P3, i.e. the center between the position P2 and P4, the positions P2 and P4 are detected and then the side edge 24 is positioned in the position P3, thereby positioning the first color separation film $1a_1$ in the correct position. The color separation film $1a_1$ is secured to the base sheet by adhesive tapes.

Figure 4:
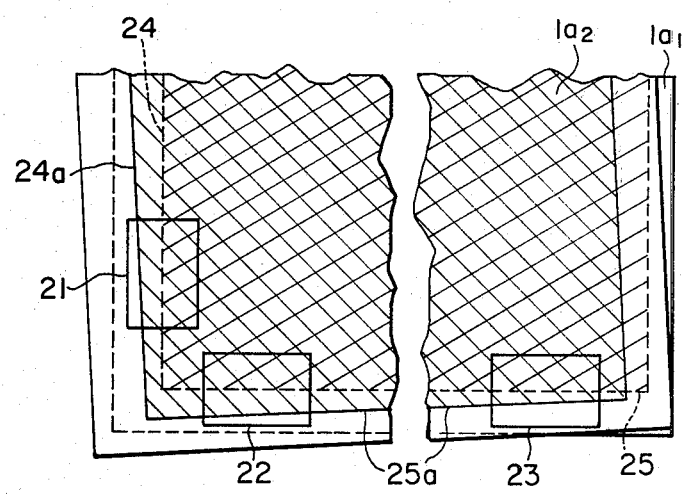
FIG. 4 shows two color films put one on another, each having a picture pattern whose edges cooperate with photoelectric detector elements according to the present invention.

Then, the second color separation film $1a_2$ with a picture pattern which is the same size and shape as the first one in the first color separation film $1a_1$, having another side edge 24a and another base edge 25a on another transparent base sheet, as shown in FIG. 4, is positioned in the correct position by adjusting the side edge 24a with respect to the detector element 21.

Figure 5:
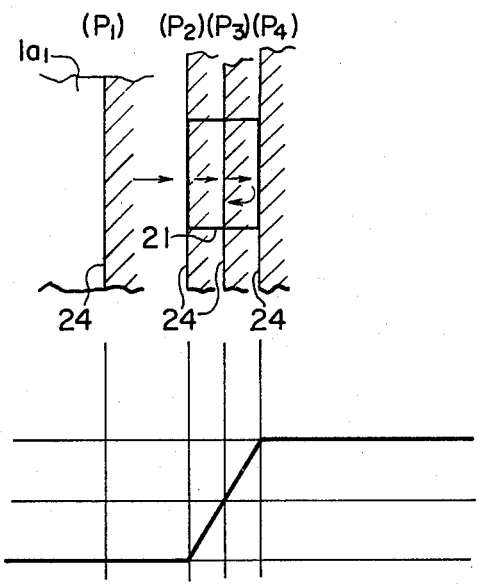
FIG. 5 shows a principle of the positioning of a first film by using a edge of a picture pattern and a photoelectric element according to the present invention.
Figure 6:
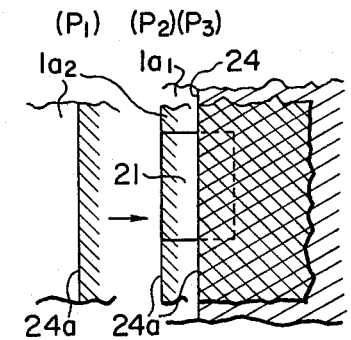
FIG. 6 shows a principle of the positioning of a second film on the first film by using the edge of the picture pattern and the photoelectric element according to the present invention.

FIG. 6 shows schematically, in the similar manner to FIG. 5, positioning operation of the second color separation film $1a_2$ on the first color separation film $1a_1$. The side edge 24a of the picture pattern in the second film $1a_2$ is moved with respect to the detector element 21 whose right half part is already shaded by the left edge portion of the picture pattern of the first film $1a_1$, as described above.

When the side edge 24a of the pattern is located in a position P1, the element 21 is shaded entirely by the picture pattern, and outputs a signal having the output level L2. Then, the side edge 24a of the pattern is moved in the right hand side direction from the position P1 to a position P2 wherein the element 21 is entirely shaded by the pattern, and then to a position P3 wherein the half of the element 21 is shaded by the side edge 24a and the element 21 outputs the signal having the output level Lc, the output level of the signal changes from L1 to Lc. When the side edge 24a of the pattern is further moved in the right hand side direction, the output level Lc of the signal from the element 21 is the same since the right half part of the element 21 is shaded by the side edge 24 of the pattern in the first film $1a1$.

Accordingly, the second color separation film $1a2$ is positioned in the desired position, i.e. the position P3 wherein the side edges 24 and 24a of the picture patterns in the first and the second films $1a1$ and $1a2$ are completely overlapped one on another, by detecting the output level Lc of the signal from the element 21 while the second color separation film $1a2$ is moved with respect to the element 21, thereby positioning the second film $1a2$ into the correct position.

From the above description, it is readily understood that when the side and the base edges 24, 24a, 25 and 25a of the first and the second color separation films $1a1$ and $1a2$ are overlapped entirely one on another with respect to the detector elements 21, 22 and 23, as shown in FIG. 3, the setting operations for the first and the second color separation films are completed. In this case, of course, the transparent base sheets for the color separation films are positioned exactly in a conventional manner, such as, with respect to a pair of register pins, or the like, which is easily carried out.

The second color separation film together with the base sheet are then removed from the first color separation film, and thereafter the third color separation film on another base sheet is positioned on the first color separation film in the same manner as described above. This operation is repeated for the other color separation films.

Figure 7:
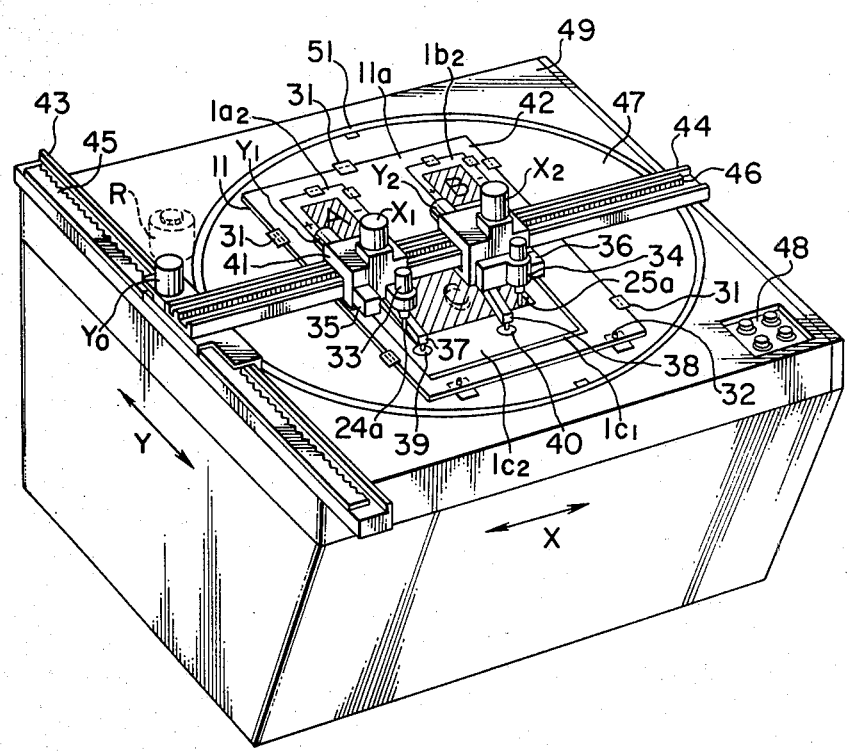
FIG. 7 is a perspective view of a machine for positioning film automatically according to the present invention.

In FIG. 7, there is shown one embodiment of the machine for positioning films automatically on base sheets according to the present invention.

Figure 8:
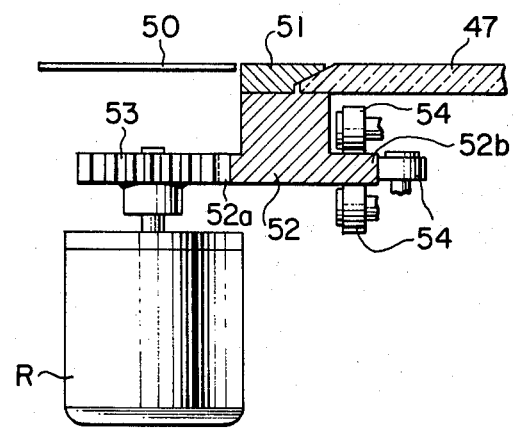
FIG. 8 is a longitudinal cross-section of a drive means for a frosted glass disc in FIG. 7.

On a register table 49 a frosted glass disc 47 is rotatably mounted and is driven by a motor R. The drive mechanism portion of the frosted glass disc 47 by the motor R is shown in FIG. 8. To the frosted glass disc 47 is secured a circular ring member 52 is provided with an outer gear 52a in its outer periphery and a guide rail 52b in its inner periphery. The outer gear 52a is engaged with a pinion 53 fixed to the drive shaft of the motor R. The guide rail 52b is supported on its three surfaces by three rollers 54 mounted to the body of the machine. A cover 50 is so arranged outside of the glass holder 51 to be positioned in the same level as the frosted glass disc 47.

Again, in FIG. 7, the frosted glass disc 47 is illuminated by a light source (not shown) disposed in the machine. In this case, the lightening of the entire surface of the disc 47 is not necessary, it is enough to illuminate some portions just under the detectors 33 and 34 for detecting the side and the base edges 24, 24a, 25 and 25a of the picture patterns in the color separation films, and thus is adapted to trace the detectors 33 and 34 while the detectors are moved.

A Y direction rail 43 having a rack 45 therealong is mounted to one side of the register table 49. A X direction rail 44 having a rack 46 therealong is movably mounted to the Y direction rail 43 in its one end and is moved in the Y direction by a motor Y0 disposed to the one end of the X direction rail 44. A pair of detector tables 41 and 42 are slidably mounted on the X direction rail 44 and are independently driven therealong by motors X1 and X2 mounted to the tables 41 and 42.

A pair of arms 37 and 38 for moving the color separation film to be positioned together with suction cups 39 and 40 mounted to the front ends of the arms 37 and 38, are movably mounted to the bottom of the detector tables 41 and 42 across the X direction rail 44, and are moved independently in the Y direction by motors Y1 and Y2 mounted to the detector tables. The suction cups 39 and 40 are connected to the suction means (not shown) which works when the suction cups hold the film on the disc 47.

Figure 9:
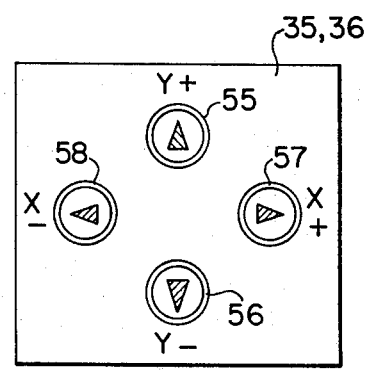
FIG. 9 is a top view of an operational board for a register mark detector in FIG. 7.

The left and the right hand side detectors 33 and 34 are vertically secured to one side of the detector table 41 and the free end of the arm 38. A pair of detector operation boards 35 and 36 for positioning the detectors 33 and 34 by driving the motors X1 and Y0; and X2 and Y2 are disposed to the one side of the detector tables 41 and 42. Such a detector operation board 35 or 36 is shown in FIG. 9 and includes four push switches 55–58 for driving the motors Y0 or Y2 and X1 or X2 so as to move the detectors 33 and 34 in +Y, −Y, +X and −X directions.

An operating panel 48 is arranged in one corner of the register table 49 and is provided with switches for starting and stopping the light source and the motor R for driving the frosted glass disc 47, and for storing and reading the positions of the detectors 33 and 34 into or out of the memory, other switches, pilot lamps, and so forth. Each motor R, X1, X2, Y0, Y1 or Y2 used is preferably a pulse motor so that the coordinates of the members such as the detectors driven by the motors may be stored in the memory by using the pulse numbers output from the motors.

As shown in FIG. 7, on the frosted glass disc 47 the transparent base sheets 11 and 11a are positioned by inserting register pins 32 into the punched apertures formed in one edges of the base sheets 11 and 11a, and are secured to the frosted glass disc 47 by the adhesive tapes 31. On the first base sheet 11 (the lower one in FIG. 7) the first color separation films 1a1, 1b1 and 1c1 for one color such as cyan, are positioned according to the desired layout, and are secured to the base sheet 11 by the adhesive tapes. On the second base sheet 11a put on the first color separation films, the second color separation films 1a2, 1b2 and 1c2 for another color such as magenta, are placed, the two films 1a2 and 1b2 are already positioned and secured to the base sheet 11a by the adhesive tapes and one film 1c2 is now being positioned by adjusting the side and the base edges 24a and 25a of the picture pattern on the film 1c2 to the detectors 33 and 34 by moving the film 1c2 by using the suction cups 39 and 40 in the same manner as described above.

Figure 10:
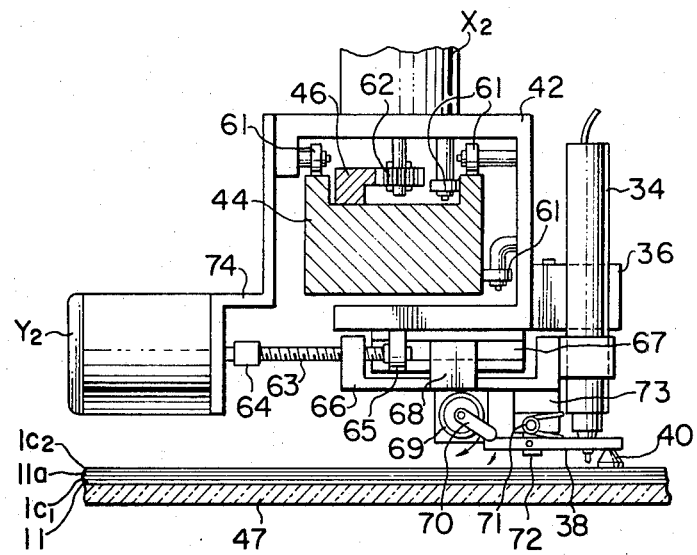
FIG. 10 is a side view of a detector table in FIG. 7.

In FIG. 10 is shown the detector table 42 for the detector 34. The detector table 42 is placed on the X direction rail 44 by four rollers 61 disposed to the table on its top and side surfaces. The motor X2 for driving the table 42 in the X direction is mounted to the table 42. A pinion 62 secured to the drive shaft of the motor X2 engages with the rack 46 on the X direction rail 44, and therefore, as the motor X2 is driven, the table 42 is moved along the X direction rail 44.

The motor Y2 is mounted on the side of the table 42 through a bracket 74. A screw rod 63 is connected to a drive shaft of the motor Y2 via a coupling member 64 in its one end and the other end is supported by a bearing 65 mounted onto the bottom of the table 42. A slide member 66 is provided with a nut member in its rear end, which engages with the screw rod 63. A guide member 67 having a dovetail is secured to the bottom of the table 42 and a guide piece 68 having a dovetail groove which engages with the dovetail of the guide member 67, is mounted onto the middle of the slide member 66. Hence, the slide member 66 is moved in the Y direction by driving the screw rod 63.

The detector 34 is secured to the front end of the slide member 66. On the bottom of the slide member 66 a rotary solenoid 69 having an actuating lever 70 and a support block 73 are mounted. The arm 38 having the suction cup 40 in its front end is pivotally mounted to the support block 73 through a pivot pin 72. The front part of the arm 38 is biased downward by a spring 71 and the rear end of the arm 38 is contacted with the actuating lever 70 of the solenoid 69.

When the solenoid 69 is actuated, the actuating lever 70 is turned downward and thus push down the rear end of the arm 38, thereby pivoting upward its front end. When the front end of the arm 38 is lowered by switching off the solenoid 69, the suction cup 40 is contacted to the color separation film 1c2 and sucks it while the suction means is switched on. Then, the rotary solenoid 69 is actuated, the arm 38 and the suction cup 40 hold up the film 1c2.

Figure 11:
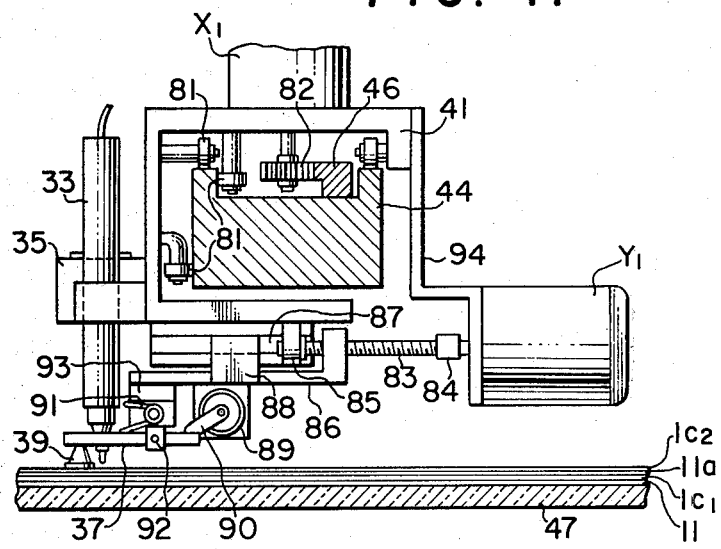
FIG. 11 is a side view of another detector table in FIG. 7.

In FIG. 11 is shown the detector table 41 for the detector 33. The construction shown in FIG. 11 is almost the same as that in FIG. 10 except that the detector 33 is secured to the side of the table 41. The motors X1 and Y1 correspond to those X2 and Y2, and rollers 81, a pinion 82, a screw rod 83, a coupling member 84, a bearing 85, a slide member 86, a guide member 87, a guide piece 88, a rotary solenoid 89, an actuating lever 90, a spring 91, a pivot pin 92, a support block 93, and a bracket 94 correspond to those members 61, 62, 63, 64, 65, 66, 67, 68, 69, 70, 71, 72, 73 and 74, respectively, in FIG. 10.

Figure 12:
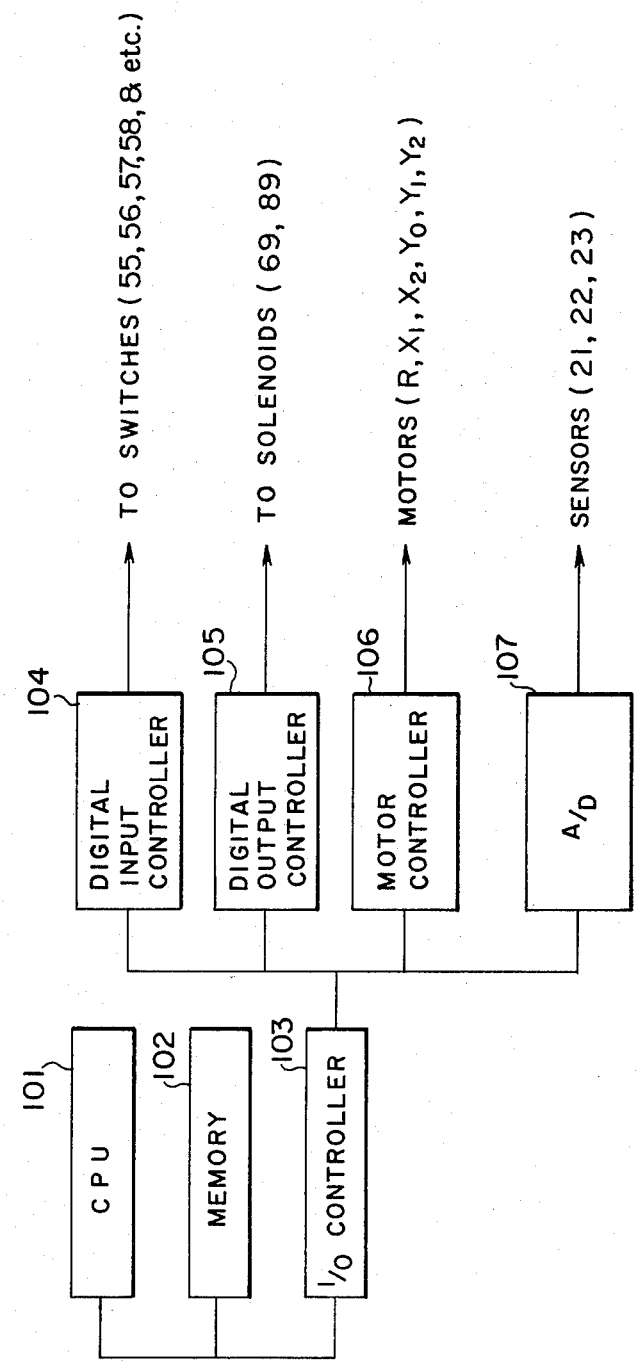
FIG. 12 is a schematic view of an electric control means for the machine in FIG. 7.

There is shown in FIG. 12 an electric control system. The switches 108 for putting on or off the electric source, driving the detector tables 41 and 42, starting the automatic operation for the positioning, and so on, are manually operated, and the operational signals generated from the operation are detected in a digital input controller 104. The detected signals are sent to an input-/output (I/O) controller 103 and then to a central processing unit (CPU) 101.

The signals processed in the CPU 101 are stored in the memory 102 as occasion demands, and are fed to a digital output controller 105 through the I/O controller 103, with the result that the digital output controller 105 controls the rotary solenoids 69 and 89 which pivot the arms 37 and 38. The signals from the CPU 101 are also sent to a motor controller 106 and an analog-digital (A/D) converter 107 via the I/O controller 103. Then, the motor controller 106 controls, i.e. drives or stops the motors R, Y0, Y1, Y2, X1 and X2, and the A/D converter 107 converts the output analog signals supplied from the sensors such as the photoelectric elements 21, 22 and 23 into the digital signals and sends the digital signals to the CPU 101 via the I/O controller 103.

The CPU processes the digital signals input and output the digital singals processed to the motor controller 106 for controlling the motors R, Y0, Y1, Y2, X1 and X2 and the digital output controller 105 for controlling the rotary solenoids 69 and 89, and the memory for storing the amounts of the rotations of the motors R, Y0, Y1, Y2, X1 and X2.

The positioning operation for the color separation films of some colors such as cyan, magenta, yellow and black, on the base sheets will be described with reference to FIG. 13.

First, the transparent base sheets 11 are provided with the punched apertures to be inserted by the register pins for positioning the precise positions, in a conventional manner such as a hand power punching means, or the like. One of the base sheets 11 punched is positioned by inserting the register pins into the punched apertures on the frosted glass disc 47 and is then secured to the frosted glass disc 47 by the adhesive tapes. Then, the first color separation films 1a1, 1b1 and 1c1 of one color such as cyan for each picture are positioned on the base sheet 11 according to the desired layout, and are secured to the base sheet 11 by the adhesive tapes 31, as shown in FIG. 13(I).

Figure 13:
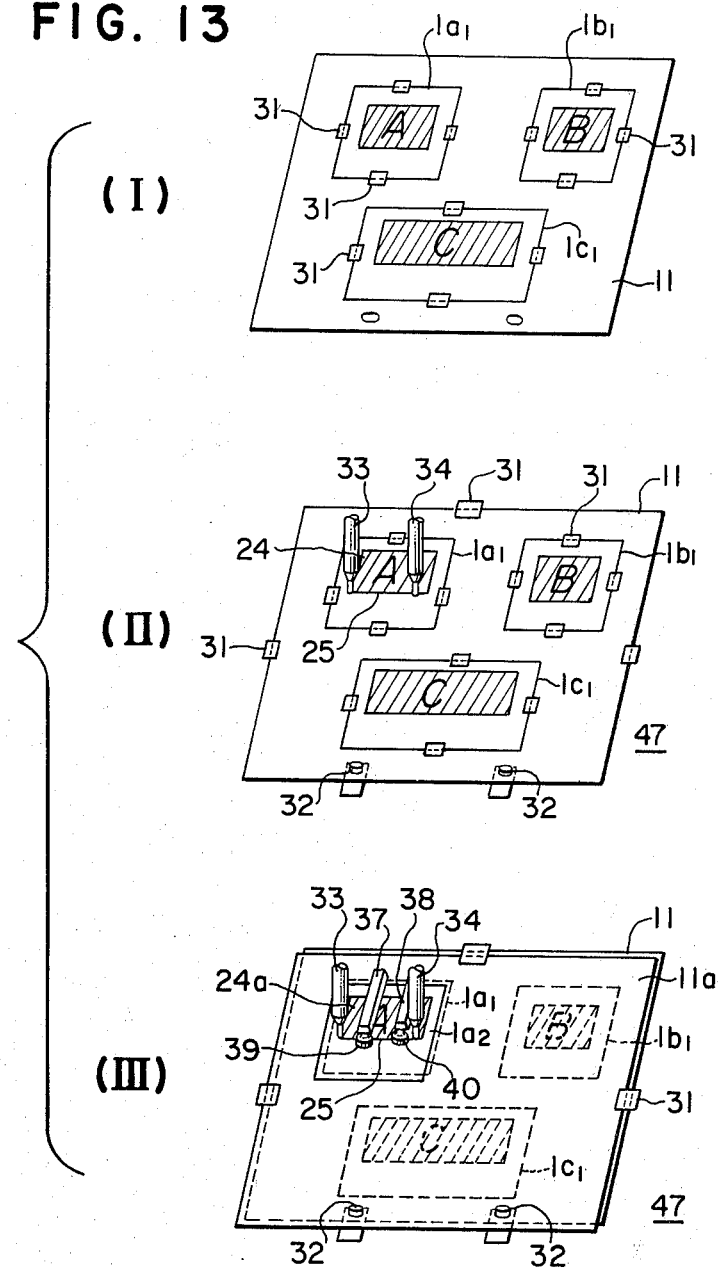
FIG. 13 shows operational steps of the positioning of films according to the present invention.

Then, as shown in FIG. 13(II), the precise positions of the edges of the picture patterns of the first separation films 1a1, 1b1 and 1c1 are detected by the machine of the present invention described above and are stored in the memory 102 as follows. The film 1a1 is first detected. The frosted glass disc 47 is turned so that the line on which the edges 24 and 25 in the film 1a1 are aligned may approximately be parallel with the X direction rail 44.

Then, the detector 33 having the elements 21 and 22 and the detector 34 having the element 23 are moved above the edges 24 and 25, respectively, by operating manually the switches 55-58 on the detector operation boards 35 and 36. The switch for the automatic positioning of the detectos 33 and 34 are switched on. The photoelectric detector elements 21, 22 and 23 in the detectors 33 and 34 cooperate with the edges 24 and 25 as described above, and send the output signals, depending on the amounts of the lights received, to the A/D converter 107 in which the output signals are converted into the digital signals and then are sent to the CPU 101 via the I/O controller 103.

If the digital signals sent to the CPU 101 are not coincident with the desired values, the CPU 101 controls the motor controller 106 via the I/O controller 103 to drive the motors R, Y0, Y1, Y2, X1 and X2 so that the detector elements 21–23 in the detectors 33 and 34 may be coincided with the edges 24 and 25 according to the principle abovementioned, and thereby the detectors 33 and 34 are precisely positioned. Then, the pulse numbers from the standard point for each motor are counted, and depending on them the precise positions of the detectors 33 and 34 or the edges 24 and 25 in the film 1a1 are stored in the memory 102.

Then, the precise positions of the edges of the picture pattern on the other films 1b1 and 1c1 are also detected and are stored in the memory 102 in the same manner as described above.

Next, as shown in FIG. 13(III), another transparent base sheet 11a is located on the first color separation films by inserting the register pins 32 into the punched apertures, and is secured to the frosted glass disc 47 by the adhesive tapes.

Then, for setting operation for the second color separation films 1a2 of another color such as magenta over the first color separation film 1a1, the detectors 33 and 34 are moved to the stored positions in the memory 102 for the film 1a1 automatically by switching on a reset switch on the operating panel 48.

The second color separation film 1a2 is so placed over the first color separation film 1a1 that the edges 24a and 25a of the picture pattern on the second film 1a2 may approximately be coincided with those 24 and 25 of the picture pattern on the first film 1a1. When an adjusting switch on the operating panel 48 is then switched on in order to switch off the powers of the rotary solenoids 69 and 89, the front ends of the arms 37 and 38 are pivoted downward by the springs 71 and 91 and hence the suction cups 39 and 40 in the front ends of the arms 37 and 38 are contacted onto the second film 1a2.

Then, the arms 37 and 38 are raised by actuating the solenoids 69 and 89 again, while the suction cups 39 and 40 hold the film 1a2. The arm 37 is moved in the Y direction so that the X direction line of the side edge 24a in the second film 1a2 may automatically be coincided with the side edge 24 in the first film 1a1 by driving the motor Y1, and the arm 38 is simultaneously moved in the Y direction so that the base edge 25a in the second film 1a2 may automatically be coincided with the base edge 25 in the first film 1a1 by driving the motor Y2, as described above.

In this operation, since the detector 34 and the arm 38 are fixed to the slide member 66, as the arm 38 is moved in the Y direction, the detector element 23 in the detector 34 is slipped somewhat from the base edge 25 of the first film 1a. However, the detector element 23 used is so large enough to cover the base edged 25, and the base edge 25a in the second film 1a2 is coincided with the base edge 25 in the first film. Accordingly, there is no problem in this operation.

Next, the Y direction line of the side edge 24a in the second film 1a2 is automatically coincided with the Y direction line of the side edge 24 in the first film 1a1 by driving the motors X1 and X2, as described above, thereby perfectly adjusting the second film 1a2 over the first film 1a1. The second film 1a2 is then secured to the second base sheet 11a by the adhesive tapes.

The adjusting order of these Y and X directions of the edges 24, 24a, 25, and 25a described above may be interchangeable or may be done in the same time. Further, when the adjustment firstly conducted of the edges in the Y direction is come out of the correct position after the adjustment secondly done of those in the X direction, these adjustments in the X and Y directions are repeated.

Then, the setting operation for the second color separation films 1b2 and 1c2 is repeated in the same manner as described above, and the films 1b2 and 1c2 are secured to the base sheet 11a by the adhesive tapes.

The second base sheet 11a with the second color separation films 1a2, 1b2 and 1c2 thereon is then removed from the register pins 32, and the other color separation films of the other colors such as yellow and black are laid out on the transparent base sheets overlaid on the first color separation base sheets overlaid on the first color separation films in the same manner as described above.

When the edges of the picture pattern of the film are inclined, the frosted glass disc 47 supporting the films is turned so that the edges may direct the X and the Y directions.

According to the present invention, reflective films and transparent films may be positioned with respect to one another by properly illuminating the detector positions or by changing the position of the light source therefor.

Although the present invention has been shown and described in terms of a preferred embodiment, however, various changes and modifications can be made by those skilled in the art without departing from the scope of the present invention.

What is claimed is:

1. A method for positioning films on base sheets, comprising the steps of:
   (a) laying out a first film having a picture pattern on a first base sheet into a desired position;
   (b) detecting the positions of edges of the picture pattern in the first film by photoelectric detector means including photoelectric element means which detect the edges of the picture pattern and output signals whose strengths are varied depending on the positions of the photoelectric element means with respect to the edges;
   (c) overlaying a second film having a picture pattern of the same shape as that in the first film on a second base sheet to the first film so that the edges of the picture pattern in the second film may approximately overlap to those in the first film; and (d) moving the second film by a drive means so that the edges in the second film may completely be coincident with those in the first film depending on the output signals from the photoelectric element means, thereby positioning the second film into the desired position.

2. A method as defined in claim 1, wherein the edges of the picture pattern in the second film are coincided with those in the first film by detecting certain values between the maximum and the minimum values of the signals output from the photoelectric element means.

3. A method as defined in claim 1, wherein the edges of the picture pattern in the second film are coincided with those in the first film by detecting the mean values between the maximum and the minumum values of the signals output from the photoelectric element means.

4. A method as defined in claim 2 or 3, wherein the positions of the edges of the picture pattern in the first film are detected by the photoelectric detector means, and then the positions of the edges of the picture pattern are stored into a memory, and wherein the photoelectric detector means is automatically positioned in the stored positions in the memory when the second film is positioned over the first film.

5. A method as defined in claim 4, wherein the output signals from the photoelectric element means are controlled by an electric controller.

6. A method as defined in claim 5, wherein the photoelectric detector means comprises two photoelectric detectors, and wherein the photoelectric element means comprises two photoelectric elements included in the one photoelectric detector and one photoelectric element included in the other photoelectric detector, the photoelectric elements cooperating the edges of the picture pattern.

7. A machine for positioning films on base sheets, comprising:
(a) a base plate on which a first film having a picture pattern in a first base sheet is laid out into a desired position and a second film having a picture pattern of the same shape as that in the first film on a second base sheet is placed on the first film;
(b) photoelectric detector means which are capable of moving over the base plate and include photoelectric element means which detect edges of the picture patterns and output signals whose strengths are varied depending on the positions of the photoelectric element means with respect to the edges; and
(c) a drive means for moving the films over the base plate depending on the output signals from the photoelectric element means so that the edges of the picture pattern in the second film may completely be coincident with those in the first film, thereby positioning the second film into the desired position.

8. A machine as defined in claim 7, wherein the signals output from the photoelectric element means are controlled by an electric controller.

9. A machine as defined in claim 8, wherein the film is moved over the base plate by suction cups actuated by suction means.

10. A machine as defined in claim 9, wherein one of the suchtion cups is connected to one of the photoelectric detector means, so as to move together.

11. A machine as defined in any of claims 8-10, wherein the base plate is made of a frosted glass and is adapted to be turned by a drive means.

12. A machine as defined in claim 11, wherein the photoelectric detector means comprises two photoelectric detectors, and wherein the photoelectric element means comprises two photoelectric elements included in the one photoelectric detector and a photoelectric element included in the other photoelectric detector, the photoelectric elements cooperating the edges of the picture pattern.

* * * * *